United States Patent [19]

Ashley

[11] 3,940,571

[45] Feb. 24, 1976

[54] DRIVE CIRCUITRY WITH ERROR DETECTION

[75] Inventor: Albert H. Ashley, Holliston, Mass.

[73] Assignee: GTE Sylvania Incorporated, Stamford, Conn.

[22] Filed: Nov. 4, 1974

[21] Appl. No.: 520,413

[52] U.S. Cl. 179/18 GF; 340/146.1 AB; 340/166 R
[51] Int. Cl.² ................ H04M 3/00; G06F 11/08
[58] Field of Search 340/146.1 AB, 166 R, 147 CN; 179/15 BF, 18 GF; 307/43, 241

[56] References Cited
UNITED STATES PATENTS

| | | | |
|---|---|---|---|
| 2,900,620 | 8/1959 | Johnson | 340/146.2 |
| 3,582,892 | 6/1971 | Juliusberger | 340/166 R |
| 3,633,180 | 1/1972 | Pabst | 340/365 E |
| 3,660,826 | 5/1972 | Lins | 340/166 R |
| 3,722,107 | 3/1973 | Muller | 340/146.1 AB |
| 3,744,024 | 7/1973 | Russel | 340/146.1 AB |
| 3,826,873 | 7/1974 | Susi | 179/18 GF |
| 3,838,277 | 9/1974 | Danielsen | 179/18 GF |
| 3,851,307 | 11/1974 | Rivas | 340/146.1 AB |

Primary Examiner—Kathleen H. Claffy
Assistant Examiner—E. S. Kemeny
Attorney, Agent, or Firm—David M. Keay; Elmer J. Nealon; Norman J. O'Malley

[57] ABSTRACT

Apparatus is disclosed for sensing and determining whether or not exactly a predetermined proper number (N) of lines, part of a larger number of lines (M) are being driven, i.e., an "N of M Detector." It includes resistances connected to each of the lines, and connected together at a common summing point juncture, whose voltage is proportional to the number of lines being driven. The summing point is sensed by two comparators ("greater than" and "less than") followed by Exclusive Or logic which can deliver a "Not Exactly N" error signal. Also disclosed therewith is a transistor crosspoint switching array circuit.

7 Claims, 5 Drawing Figures

DRIVE CIRCUITRY WITH ERROR DETECTION

BACKGROUND OF THE INVENTION

This invention relates to circuitry for supplying drive power to any of a number of paths. More particularly, it is concerned with drive circuitry including arrangements for determining if the proper number of paths are being driven.

Crosspoint switching arrays employing solid state devices have been developed for use in switching networks of communication systems. An array of switching circuits employing solid state devices is described and claimed in U.S. Pat. No. 3,826,873 entitled "Switching Circuit Employing Latching Type Semiconductor Devices and Associated Control Transistors" which issued on July 30, 1974 to A. Frederick Susi and is assigned to the assignee of the present invention. As described in the patent to Susi a switching circuit of an array is connected to one control line in each of two sets of control lines. An individual switching circuit is activated to permit the transmission of signals by the simultaneous application of momentary pulses of opposite polarity on its two control lines. The two sets of control lines, one for positive-going control pulses and the other for negative-going control pulses, are connected to the switching circuits of the array so that only one switching circuit is selected when a positive-going pulse is applied to one of the control lines of one set and a negative-going pulse is applied to one of the control lines of the other set.

In switching arrays of the foregoing type it is desirable before accomplishing the activation of a switching circuit during a switching operation to ascertain that one and only one switching circuit is being selected. That is, it is desirable to be able to determine that a control pulse will be present on one and only one positive-going control line and also that a control pulse will be present on one and only one negative-going control line. Thus, it is assured that one and only one switching circuit of the array will be activated during the switching operation to permit the transmission of signals therethrough.

SUMMARY OF THE INVENTION

Apparatus in accordance with the present invention permits the monitoring of a set of paths, such as control lines, to determine whether or not signals are present on only a predetermined number of the paths, for example, a single one of the control lines of the set. The apparatus employs a plurality of signal paths. A first detecting means is coupled to the signal paths and produces a first indication when a predetermined number (N, for example one) or more signal paths have signals present thereon during a detection period. The first detecting means produces a second indication when less than the predetermined number (N) of signal paths have signals present thereon during a detection period. A second detecting means is also coupled to the plurality of signal paths and produces a first indication when less than the predetermined number plus one (N+1, for example two, if the predetermined number (N) is one) signal paths have signals present thereon. The second detecting means produces a second indication when the predetermined number plus one (N+1) or more signal paths have signals present thereon. The apparatus also includes an output means which is coupled to the first and to the second detecting means. The output means produces an error signal in response to a second indication from the first detecting means or from the second detecting means. That is, if the predetermined number (N) of paths is one, the output means produces an error signal during a detection period if there is no signal present on any of the paths or if there are signals present on two or more signal paths. If only one path is transmitting a signal, no error signal is produced.

BRIEF DESCRIPTION OF THE DRAWINGS

Additional objects, features, and advantages of apparatus in accordance with the present invention will be apparent from the following detailed discussion together with the accompanying drawings wherein.

DETAILED DESCRIPTION OF THE INVENTION

Figure 1:
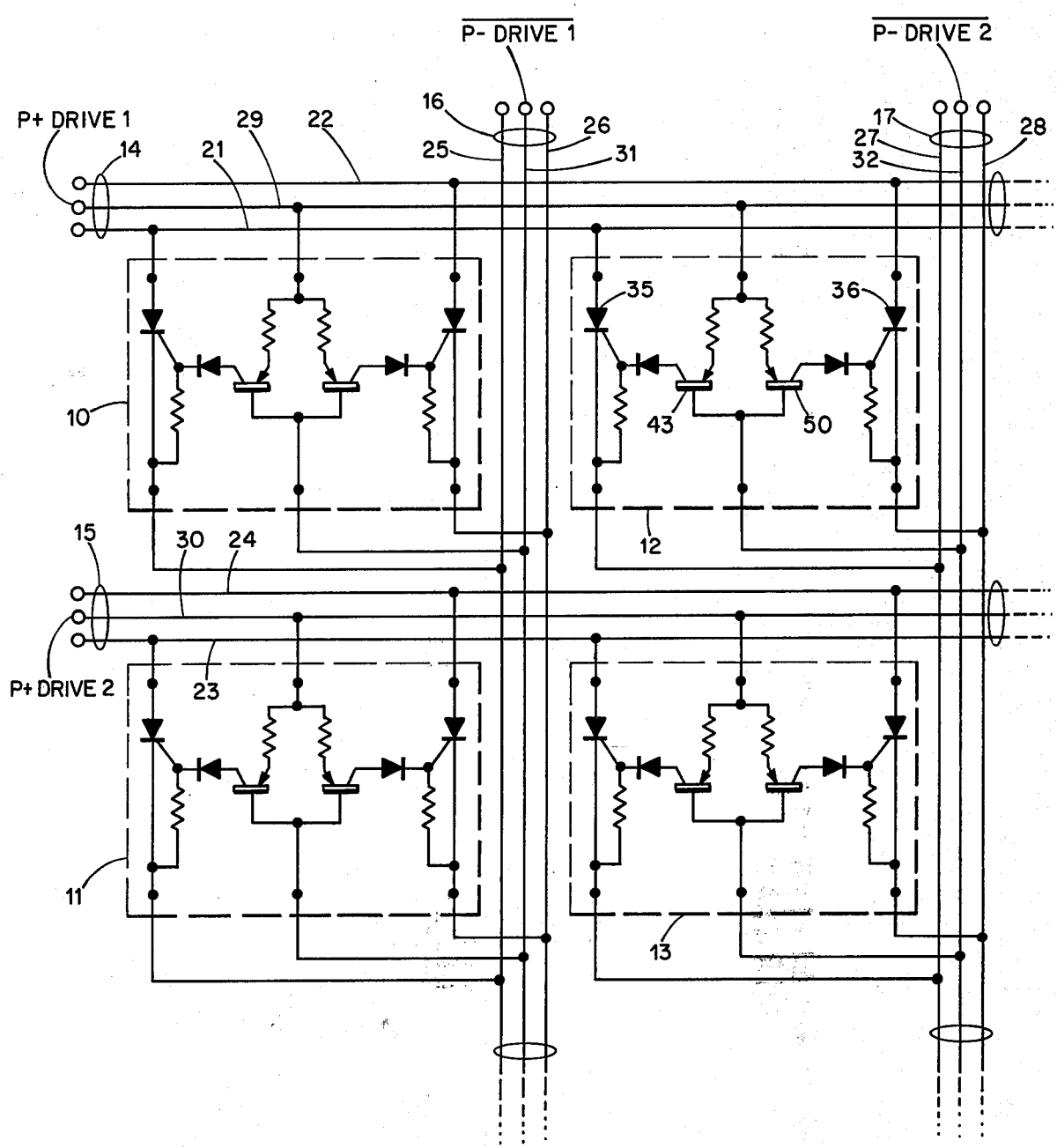
FIG. 1 is a schematic circuit diagram of a 2-by-2 matrix from an array of crosspoint switching circuits.

Shown in FIG. 1 is a portion of a switching array which for simplicity is a 2-by-2 matrix of switching crosspoints. In the array of crosspoint switching circuits 10, 11, 12, and 13 as illustrated, either the first or second group of transmission lines 14 and 15 of a first set can be connected to either the first or second transmission line groups 16 or 17 of a second set as desired. That is, any transmission line group 14 or 15 of the first set may be connected to any transmission line group 16 or 17 of the second set by activation of the appropriate crosspoint switching circuit 10, 11, 12, or 13. Each of the transmission line groups 14, 15, 16, and 17 as illustrated includes two signal lines 21 and 22, 23 and 24, 25 and 26, and 27 and 28, and a single control line 29, 30, 31, and 32, respectively.

As explained in detail in the aforementioned patent to Susi, an individual switching circuit is activated by applying a momentary positive-going pulse to one of control lines 29 or 30 and simultaneously applying a momentary negative-going pulse to one of control lines 31 or 32. For example, a positive P+DRIVE 1 signal on control line 29 and a negative P−DRIVE 2 signal on line 32 causes the transistors 43 and 50 of the crosspoint switch 12 to become conductive. Conduction in transistors 43 and 50 causes controlled latching semiconductor devices 35 and 36 to be triggered on. As is well known, the controlled latching semiconductor devices remain on after termination of the control pulses to provide signal transmission paths between lines 21 and 22 and lines 27 and 28.

As can be seen from FIG. 1, if control pulses are present on more than one positive control line or on more than one negative control line, more than one switching circuit undesirably will be activated. For example, if during a positive-going P+DRIVE 1 pulse on line 29 negative-going P−DRIVE 1 and P−DRIVE 2 pulses occur on both lines 31 and 32, both switching circuits 10 and 12 will be activated. In order to avoid such an occurrence it is desirable to check the control signals being applied to the control lines prior to the switching action taking place in order to insure that one and only one of the switching circuits of the array will be activated.

Figure 2:
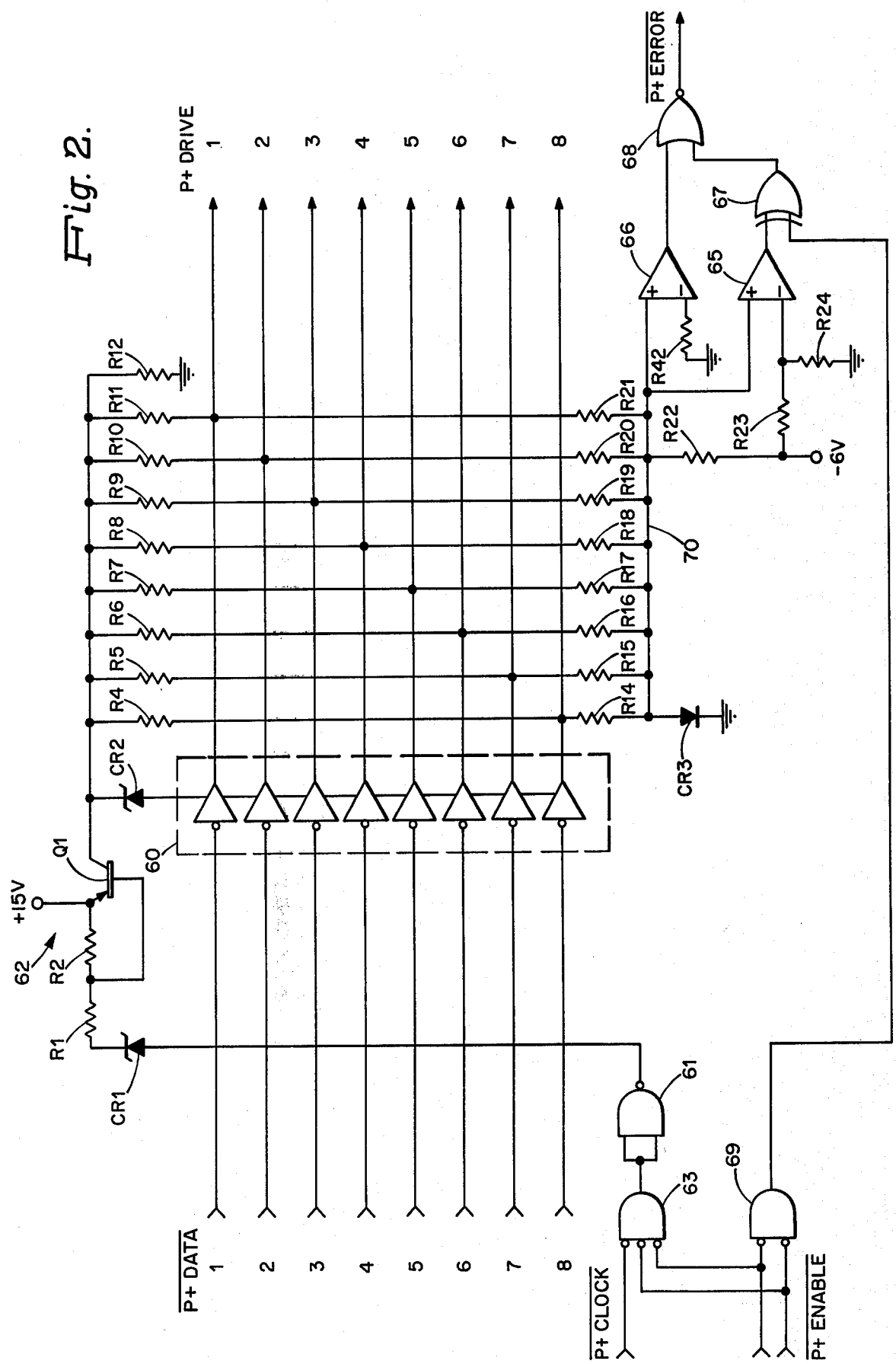
FIG. 2 is a schematic circuit diagram of drive circuitry and detection circuitry in accordance with the present invention for providing positive-going control pulses to one set of control lines of the array illustrated by FIG. 1.

FIG. 2 illustrates circuitry in accordance with the present invention for producing positive-going drive pulses to several of the control lines of one set and also for detecting whether or not a drive pulse is being produced on one and only one control line. The circuit of FIG. 2 receives switching information for selecting a switching circuit of the array in the form of negative-going logic signals P+DATA 1 - P+DATA 8 at the eight data input terminals of the circuit. The circuit provides P+DRIVE 1 - P+DRIVE 8 signals at corresponding output terminals which are connected to positive control lines such as 29 and 30 of FIG. 1. A P+DRIVE signal is a positive-going relatively high voltage signal which by itself is not sufficient to activate a switching circuit, but which in combination with a signal on the negative control line to a switching circuit will activate the circuit.

The apparatus includes an arrangement of eight drive circuits 60, one in each of the lines. The drive circuits 60 are open-collector inverters with each collector connected through a resistance R4 through R11 to a power supply 62. The power supply 62 includes a 30 15 volt supply connected to the emitter of a PNP transistor Q1. The collector of transistor Q1 is connected to resistances R4 through R11 and through resistance R12 to ground. The collector of transistor Q1 is also connected to the drive circuits 60 through a zener diode CR2 to provide operating potential to the drive circuits. A resistance R2 is connected between the base and the emitter of transistor Q1. The base of transistor Q1 is connected by a resistance R1 and a zener diode CR1 to the output of a NAND gate connected as an inverter 61. The power supply 62 is turned on to provide operating potential to the drive circuits 60 and driving power to the drive circuit outputs only when the inverter 61 produces a high logic level at its output. The input to the inverter 61 is connected to the output of a NOR gate 63. There are three inputs to the NOR gate 63, two labeled P+ENABLE signals and one P+CLOCK signal. Only when all three of these inputs to the NOR gate 63 are low will the power supply 62 be activated and permit a drive circuit 60 to produce a P+DRIVE output signal in response to a corresponding P+DATA input signal.

The detection circuitry of the apparatus for determining whether one and only one P+DRIVE signal is being produced includes a network of equal resistances R14 through R21. Each resistance has one end connected to a different one of the output terminals from the drive circuits 60 and its other end connected to a common juncture 70. A diode CR3 is connected between the common juncture and ground, and a resistance R22 is connected between the common juncture and a power supply of −6 volts. The voltage at the common juncture 70 is determined by the number of lines having P+DRIVE signals thereon. The resistance network R14-R21 together with resistance R22 and the −6 volt supply provides a summing of voltages at the common juncture 70, so that the voltage varies in increments depending upon the number of resistances having a voltage drop thereacross due to current passing therethrough from the associated lines having P+DRIVE signals thereon.

A first comparator circuit 65 has its positive input connected directly to the common juncture 70 of the resistance network and its negative input connected to the −6 volt supply through a resistance R23 and to ground through a resistance R24. The reference voltage applied to the negative input of the first comparator 65 is such that in the absence of P+DRIVE signals on all the lines the voltage at the common juncture 70 causes the output of the comparator 65 to be low. If a P+DRIVE signal is present on any one or more than one of the lines, the voltage produced at the common juncture 70 is sufficiently high so that the output of the comparator 65 is at a relatively high level.

A second comparator 66 has its positive input connected to the common juncture 70 and its negative input connected to ground through a resistance R42. The second comparator 66 operates to produce a low output level when the voltage at the common juncture 70 is that produced by no P+DRIVE signals or by a P+DRIVE signal on only one line. If two or more of the lines have P+DRIVE signals present, the resulting voltage at the common juncture 70 causes the output of the second comparator 66 to be high.

The output of the first comparator 65 is applied to one of the inputs of an exclusive-OR gate 67. The other input to the exclusive-OR gate 67 is from a NOR gate 69. The inputs to the NOR gate 69 are the P+ENABLE signals previously discussed with respect to the NOR gate 63 for controlling the power supply 62. As explained previously the P+ENABLE signals must both be low to activate the power supply 62. Under these conditions the output of the NOR gate 69 is high. While the output of the NOR gate 69 is high if, at the same time, the output from the first comparator 65 is low indicating that there are no P+DRIVE signals present on any of the drive lines, the output of the exclusive-OR gate 67 is high. If the output from the first comparator 65 is high indicating that there is a P+DRIVE signal present on at least one of the drive lines, the output of the exclusive-OR gate 67 is low.

The outputs from the second comparator 66 and from the exclusive-OR gate 67 are applied to a NOR gate 68. The NOR gate 68 produces a high level output signal while both the output of the second comparator 66 and the exclusive-OR gate 67 remain low. If either of these outputs is high, a low level P+ERROR signal is produced by the NOR gate 68. A low level P+ERROR signal from the NOR gate 68 indicates an error; either none of the drive lines has a P+DRIVE signal thereon, or two or more drive lines have P+DRIVE signals thereon.

Figure 3:
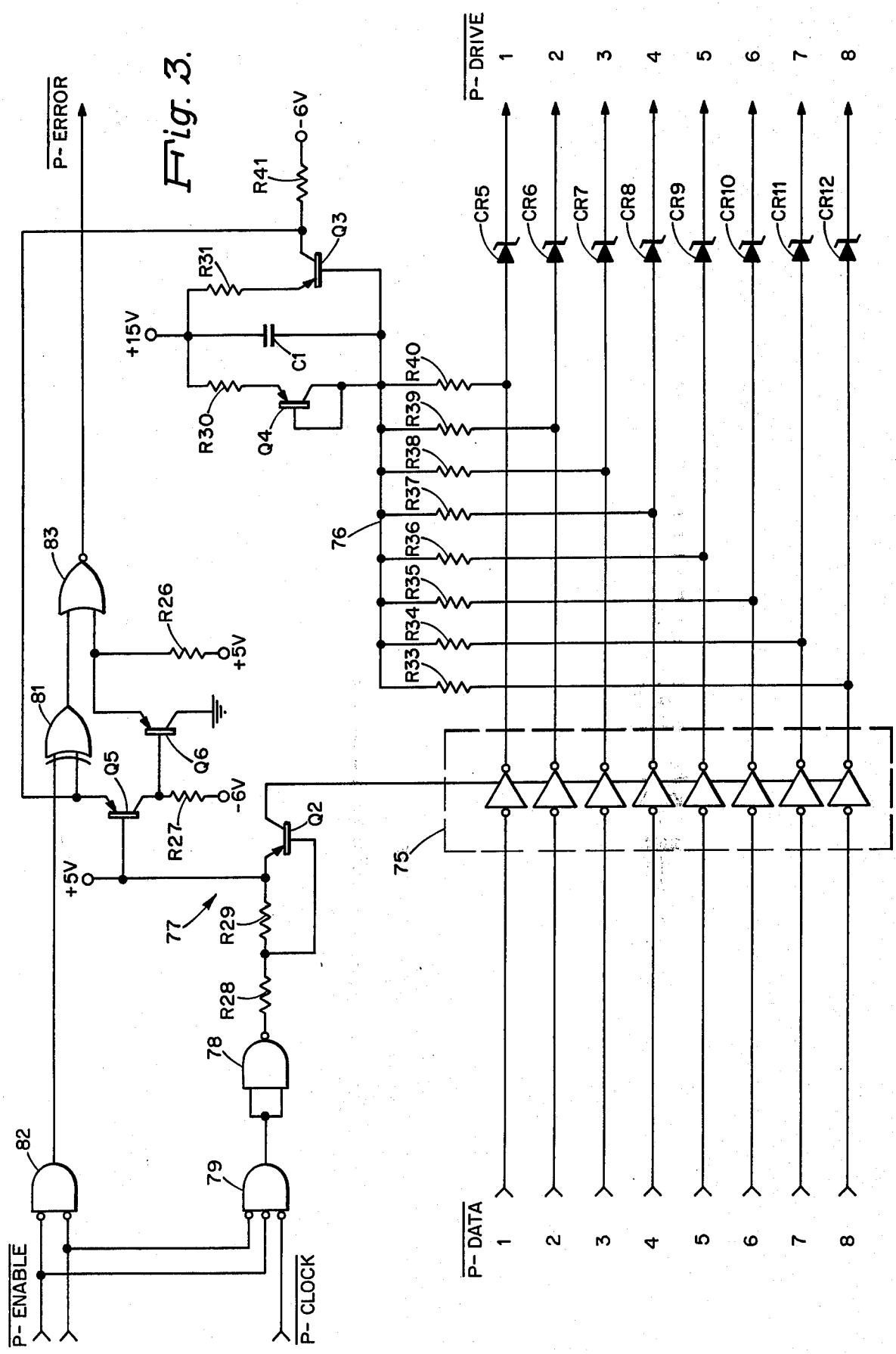
FIG. 3 is a schematic diagram of drive circuitry and detection circuitry in accordance with the present invention for providing negative-going control pulses to the other set of control lines of the array illustrated by FIG. 1.

FIG. 3 illustrates apparatus which produces negative-going P−DRIVE 1 - P−DRIVE 8 signals in response to corresponding P−DATA 1 - P−DATA 8 low logic level input signals. Eight open-collector buffer drive circuits 75 are connected between the input and output terminals of the eight lines. When activated, a buffer drive circuit 75 produces a negative-going P−DRIVE signal which is essentially at ground level. The output terminal of each of the drive circuits 75 is connected to one of zener diodes CR5 through CR12 for reasons which will be explained hereinbelow.

Operating potential to the drive circuits 75 is provided by a power supply 77 which includes a +5 volt supply and a PNP transistor Q2 having its emitter connected to the voltage source and its collector to the drive circuits 75. A resistance R29 is connected between the base and the emitter of transistor Q2 and the base is connected through a resistance R28 to the output of a NAND gate connected to form an inverter 78. The input to the inverter 78 is from a NOR gate 79 which has three inputs including two $\overline{\text{P-ENABLE}}$ signals and a $\overline{\text{P-CLOCK}}$ signal. The combination of the NOR gate 79 and inverter 78 requires that both the $\overline{\text{P-ENABLE}}$ signals and the $\overline{\text{P-CLOCK}}$ signal be at a low logic level in order for the power supply 77 to be activated and provide operating potential to the drive circuits 75.

A network of eight equal resistances R33 through R40 each have one end connected to a respective output terminal of a drive circuit 75 and the other end connected to a common juncture 76. The common juncture 76 is connected through a transistor Q4 arranged as a diode and a resistance R30 to a +15 volt supply. A capacitance C1 is connected between the voltage source and the common juncture 76 to eliminate transient effects. A PNP transistor Q3 has its base connected directly to the common juncture 76 and its emitter connected through a resistance R31 to the +15 volt supply. Its collector is connected through a resistance R41 to a −6 volt power supply.

The voltage at the common juncture 76 depends on the number of drive lines having $\overline{\text{P-DRIVE}}$ signals present. The currents flowing through the network resistances R33-R40 are summed with a fixed gain of R30/R31 (less than one) to produce a resultant collector current through resistance R41. Thus the voltage at the collector of transistor Q3 depends on the number of drive lines having $\overline{\text{P-DRIVE}}$ signals.

The collector of transistor Q3 is connected to one of the inputs of an exclusive-OR gate 81. The other input to the exclusive-OR gate 81 is from the output of a NOR gate 82. The two $\overline{\text{P-ENABLE}}$ signals are the inputs to NOR gate 82. The output of the exclusive-OR gate 81 is connected to one input of a NOR gate 83. The collector of transistor Q3 is also connected to the emitter of a PNP transistor Q5. The base of transistor Q5 is connected to the +5 volt supply and its collector is connected through a resistance R27 to a −6 volt supply. The collector of transistor Q5 is also connected to the base of another PNP transistor Q6 which has its collector connected to ground. The emitter of transistor Q6 is connected through a resistance R26 to a +5 volt supply and also to the other input of the NOR gate 83.

The arrangement of the various resistances and transistor Q3 is such that when there is no $\overline{\text{P-DRIVE}}$ signal on any of the drive lines, the voltage at the common juncture 76 biases transistor Q3 to a low or essentially non-conducting condition. The resulting voltage at its collector presents a low logic level to the exclusive-OR gate 81 and biases transistor Q5 to a low or essentially non-conducting condition. Transistor Q5 in turn biases Q6 to a low or essentially non-conducting condition producing a low logic level to the NOR gate 83.

If a $\overline{\text{P-DRIVE}}$ signal is present on one of the lines, the voltage at the common juncture 76 decreases sufficiently to bias the transistor Q3 to a first high conduction condition. This condition produces a voltage at the collector of transistor Q3 which is a high logic level signal to the exclusive-OR gate 81 but is not sufficiently high to change the conduction condition of transistor Q5.

If two or more of the drive circuits 75 are activated and produce $\overline{\text{P-DRIVE}}$ signals on their associated lines, the voltage at the common juncture 76 is sufficiently low to bias transistor Q3 to a second more highly conductive condition. Under these conditions a higher voltage is produced at its collector. This voltage is a high level logic signal to the exclusive-OR gate 81 and in addition is sufficient to bias transistor Q5 to conduction. With transistor Q5 conducting, transistor Q6 is also biased to conduction. The resulting voltage at the emitter of transistor Q6 is a high level logic signal to the NOR gate 83.

Thus, if during the presence of $\overline{\text{P-ENABLE}}$ signals which produce a high level input to the exclusive-OR gate 81 none of the drive lines has a $\overline{\text{P-DRIVE}}$ signal thereon, transistor Q3 produces a low level logic signal to the input to the exclusive-OR gate 81, and the output of the exclusive-OR gate 81 to the NOR gate 83 is a high level signal. As a result a low level $\overline{\text{P-ERROR}}$ signal is produced by the NOR gate 83. If only a single line has a $\overline{\text{P-DRIVE}}$ signal thereon during the $\overline{\text{P-ENABLE}}$ signals, then both inputs to the exclusive-OR gate 81 are high, and its output is low. The resulting output from the NOR gate 83 is a high level signal. When two or more of the drive circuits 75 are operating, transistor Q3 is in its second high conduction condition turning transistors Q5 and Q6 on. The resulting high level signal at the emitter of transistor Q6 causes the $\overline{\text{P-ERROR}}$ output signal of the NOR gate 83 to be low.

Figure 4:
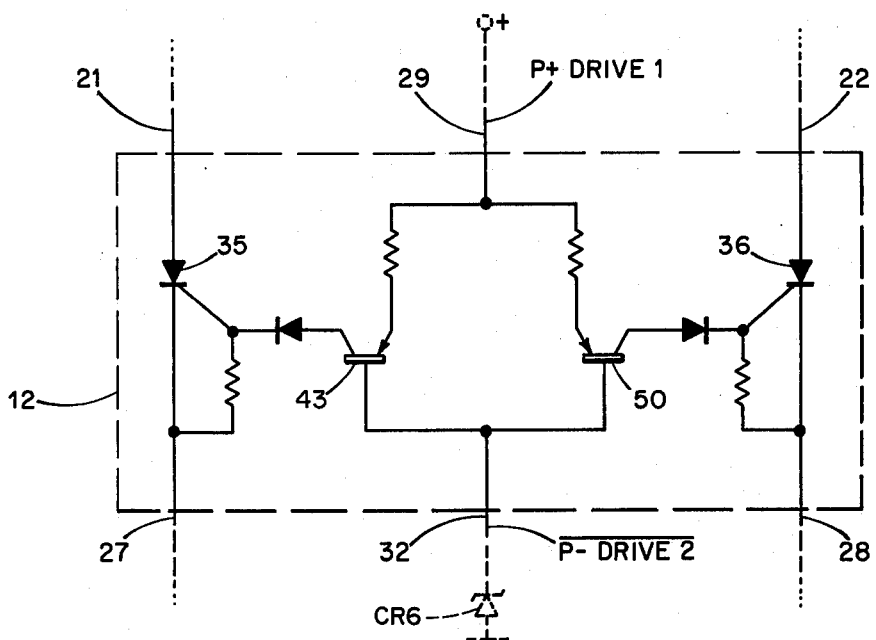
FIG. 4 is a schematic circuit diagram of one of the crosspoint switching circuits of the matrix of FIG. 1 illustrating the manner in which a switching circuit is activated to provide signal transmission paths therethrough.
Figure 5:
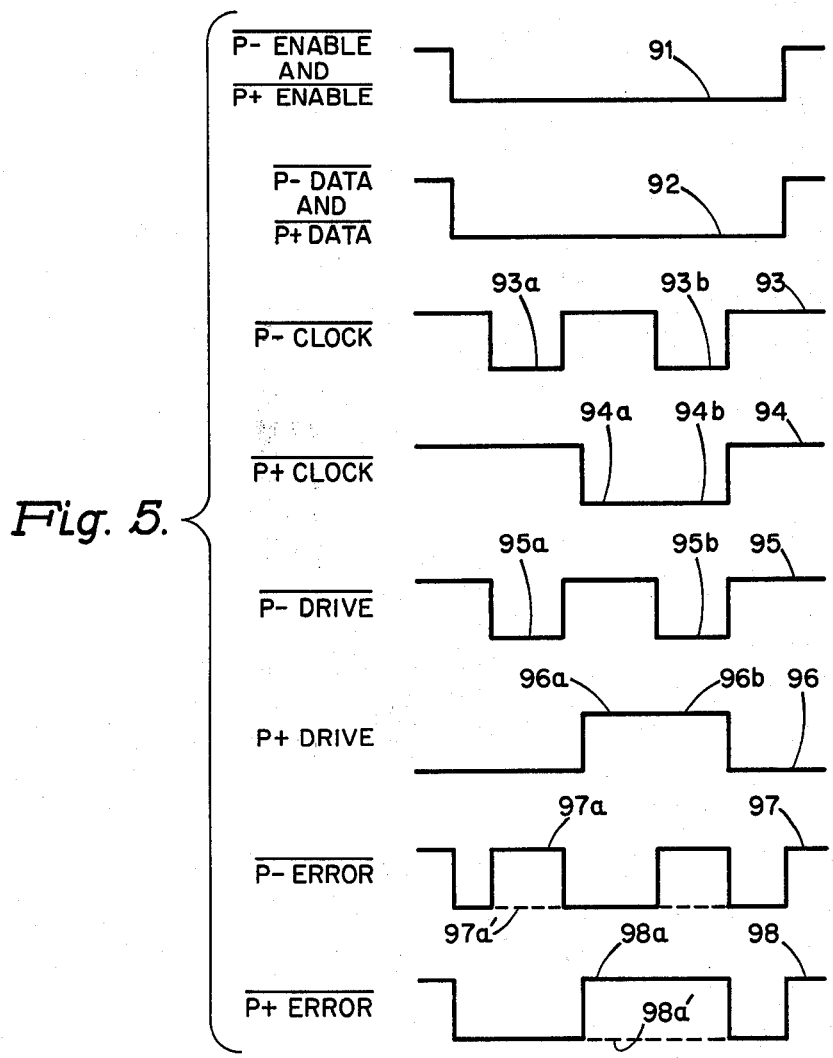
FIG. 5 is a set of voltage curves useful in explaining the operation of the circuits of FIGS. 2 and 3 when activating a switching circuit as shown in FIGS. 1 and 4.

The manner in which the drive and error detection circuitry of FIGS. 2 and 3 operate in conjunction with a crosspoint switching array employing semiconductor switching circuits as shown in FIGS. 1 and 4 during a switching operation is best explained by a discussion of the voltage curves of FIG. 5. As can be seen from FIGS. 2 and 3 each circuit is capable of handling eight control lines. As shown each circuit has two enable inputs which provide a unique address for four circuits to be used in a system. That is, the particular combination as shown can be utilized with an array of 1024 switching circuits arranged in a 32-by-32 matrix.

In order for one of the switching circuits of the array, specifically switching circuit 12, to be turned on P+DRIVE 1 and $\overline{\text{P-DRIVE}}$ 2 signals must occur simultaneously on its control lines 29 and 32, respectively. In accordance with the previous discussion, a P+DRIVE 1 signal is produced during a P+DATA 1 input while both P+ENABLE signals and the P+CLOCK signal are present. Similarly, a $\overline{\text{P-DRIVE}}$ 2 signal is produced during a $\overline{\text{P-DATA}}$ 2 input while both $\overline{\text{P-ENABLE}}$ signals and the $\overline{\text{P-CLOCK}}$ signal are present.

FIG. 5 shows various signals and resulting voltage during a switching operation. To select the particular circuits, the P+ENABLE and $\overline{\text{P-ENABLE}}$ signals must be low as shown in curve 91. Also the appropriate P+DATA and $\overline{\text{P-DATA}}$ signals 92 must be low. It is the purpose of the error detection circuitry to determine that there is one and only one P+DATA signal and one and only one $\overline{\text{P-DATA}}$ signal.

While the low level data and enable signals are present, a first negative-going $\overline{\text{P-CLOCK}}$ pulse 93a is applied to NOR gate 79. Since all the inputs to the NOR gate 79 are low during the pulse, power supply 77 is turned on providing operating potential to the drive circuits 75. A P—DRIVE signal 95a is produced on any drive lines having corresponding P—DATA signals present at their input terminals. A P—DRIVE 2 signal is produced on control line 32, but by itself this signal is not sufficient to trigger switching circuit 12 or any other switching circuit on. Also during this detection period the network of resistances R33-R40, transistors Q3, Q5, and Q6, exclusive-OR gate 81, and NOR gate 83, and their associated components operate as previously explained to detect errors. If only a single P—DRIVE signal is present, the P—ERROR signal 97a is positive. If there is no P—DRIVE signal or more than one P—DRIVE signal, the P—ERROR signal is low as indicated by the dotted line 97a'. A P—ERROR signal may be used by other apparatus which is not part of the present invention to perform suitable functions in view of an error having been detected.

After termination of the first P—CLOCK pulse 93a and consequently the P—DRIVE signal 95a, a negative-going P+CLOCK pulse 94 is applied to the NOR gate 63 of FIG. 2. As shown in FIG. 5 the first portion 94a of the P+CLOCK pulse occurs while the P—CLOCK signal is high. In combination with the two low level P+ENABLE signals the P+CLOCK signal causes the power supply 62 to turn on and activate the drive circuits 60. Thus, positive-going P+DRIVE signals 96 are produced on any drive lines having P+DATA signals thereon. A P+DRIVE 1 signal is produced on the control line 29 but by itself this signal is not sufficient to trigger switching circuit 12 or any other switching circuit on. During this period the network of resistances R14-R21, comparators 65 and 66, exclusive-OR gate 67, and NOR gate 68 operate as previously explained to detect errors. If only a single P+DRIVE signal is present, the P+ERROR signal 98a is positive. If there is no P+DRIVE signal or more than one P+DRIVE signal, the P+ERROR signal is low as indicated by the dotted line 98a'. A P+ERROR signal may also be used by other apparatus of the system to perform suitable functions in view of an error having been detected.

The use of separately occurring P—CLOCK 93a and P+CLOCK 94a pulses as shown in FIG. 5 permits separate checking for P—DRIVE signals and P+DRIVE signals on the corresponding control lines. During this testing period of the switching operation none of the switching circuits of the array is activated. If an error is detected during the testing period suitable equipment can be activated by the error signal to terminate the operation before an incorrect switching situation occurs.

Upon completion of the testing period the P+CLOCK pulse 94b continues and a second P—CLOCK pulse 93b is applied to the NOR gate 79. In the absence of an error, with the P—ENABLE and P+ENABLE signals 91 still low and the P—DATA 2 and P+DATA 1 signals also still low, a P—DRIVE 2 pulse 95b and a P+DRIVE 1 pulse 96b are produced simultaneously. As illustrated in phantom in FIG. 4 these signals provide a positive voltage on control line 29 and ground on control line 32. These conditions occurring simultaneously cause the two switching transistors 43 and 50 to conduct. The zener diode CR6 causes the combination of the two drive pulses P+DRIVE 1 and P—DRIVE 2 to properly bias the transistors in their active region. Conduction in the transistors triggers the latching semiconductor devices 35 and 36 on thereby connecting signal transmission lines 21 and 22 to signal transmission lines 27 and 28.

Specific embodiments of drive circuits as illustrated in FIGS. 2 and 3 were fabricated employing the components listed below.

| | |
|---|---|
| Inverter Driver 60 | SN5406J |
| Buffer Driver 75 | SN5407J |
| Comparators 65 and 66 | MC1514L |
| NOR gates 63 and 79 | SN5427J |
| NOR gates 68, 69, 82, and 83 | SN5402J |
| NAND gates 61 and 78 | SN5438J |
| Exclusive-OR gates 67 and 81 | SN5486J |
| Transistors Q1-Q6 | 2N2907 |
| Zener diodes CR1 and CR2 | 1N757A (9.1 v) |
| Diode CR3 | 1N4148 |
| Zener diodes CR5-CR12 | 1N754A (6.8 v) |
| C1 | .01 μf |
| R1 | 330 Ω |
| R2 | 1 k Ω |
| R4-R12 | 1.21 kΩ |
| R14-R21 | 36.5 kΩ |
| R22 | 10 kΩ |
| R23 | 16.2 kΩ |
| R24 | 3.16 kΩ |
| R26 | 10 kΩ |
| R27 | 3.16 kΩ |
| R28 | 1 kΩ |
| R29 | 1 kΩ |
| R30 | 100 Ω |
| R31 | 133 Ω |
| R33-R40 | 1.21 kΩ |
| R41 | 1.21 kΩ |
| R42 | 6.81 kΩ |

The apparatus of FIGS. 2 and 3 as described may be operated in conjunction with an array of switching circuits as shown, for example, in FIGS. 1 and 4. Any suitable apparatus may be employed to generate the various input signals to the system and to utilize the error signals. The apparatus of FIGS. 2 and 3 each provide an arrangement for producing driving signals on any of a number of paths, for determining whether or not signals are being transmitted on a particular predetermined number of the paths or on more or less than the predetermined number of paths, and for producing an error signal if signals are present on more or less than the predetermined number of paths.

Thus, while there has been shown and described what are considered preferred embodiments of the present invention, it will be obvious to those skilled in the art that various changes and modifications may be made therein without departing from the invention as defined in the appended claims.

What is claimed is:

1. Apparatus for transmitting signals along a plurality of paths and for determining whether or not signals are being transmitted on a predetermined number of the paths, said apparatus including in combination a plurality of signal paths;

a resistance network comprising an equal plurality of resistances, each resistance having one end connected to a different one of said signal paths and the other end connected to a common juncture, the voltage level produced at the common juncture being proportional to the number of signal paths having signals present thereon;

first detecting means coupled to said common juncture and operable to produce a first indication in response to a voltage level at said common juncture produced by a predetermined number (N) or more signal paths having signals present thereon during a detection period, and operable to produce a second indication in response to a voltage level at said common juncture produced by less than the predetermined number (N) of signal paths having signals present thereon during a detection period;

second detecting means coupled to said common juncture and operable to produce a first indication in response to a voltage level at said common juncture produced by less than said predetermined number plus one (N+1) signal paths having signals present thereon, and operable to produce a second indication in response to a voltage level at said common juncture produced by said predetermined number plus one (N+1) or more signal paths having signals present thereon; and output means coupled to said first and second detecting means for producing an error signal in response to a second indication from the first detecting means or from the second detecting means.

2. Apparatus in accordance with claim 1 including enabling means for producing an enabling signal in response to predetermined input conditions being applied thereto;

said first detecting means being coupled to said enabling means, said first detecting means being operable to produce said first indication when said predetermined number (N) or more signal paths have signals present thereon during an enabling signal and being operable to produce said second indication when less than the predetermined number (N) of signal paths have signals present thereon during an enabling signal.

3. Apparatus in accordance with claim 2 including activating means for activating said signal paths to permit the passage of signals therealong; and control means coupled to said activating means for preventing said activating means from activating said signal paths in the absence of said predetermined input conditions being applied thereto.

4. Apparatus in accordance with claim 3 wherein each of said plurality of signal paths includes an input terminal adapted to receive input signal data, an output terminal, and a driving means connected between said input and output terminals for producing a driving voltage at the output terminal in response to input signal data at the input terminal;

said activating means is coupled to said driving means of the plurality of signal paths and is operable to activate said signal paths by applying operating potentials to said driving means; and said one end of each of said resistances is connected to the output terminal of its associated signal path.

5. Apparatus in accordance with claim 4 wherein said first detecting means includes a first comparator means having one input connected to said common juncture and another input connected to a first point of reference potential, said first comparator means being operable to produce a first output signal when the voltage at the common juncture is that produced by less than the predetermined number (N) of signal paths having signals present thereon, and to produce a second output signal when the voltage at the common juncture is that produced by the predetermined number (N) or more signal paths having signals present thereon, and exclusive-OR means connected to the first comparator means and to said enabling means, said exclusive-OR means being operable to produce said first indication during an enabling signal in response to a second output signal from the first comparator means and to produce said second indication during an enabling signal in response to a first output signal from the first comparator means;

said second detecting means includes a second comparator means having one input connected to said common juncture and another input connected to a second point of reference potential, said second comparator means being operable to produce said first indication when the voltage at the common juncture is that produced by less than the predetermined number plus one (N+1) signal paths having signals present thereon, and to produce said second indication when the voltage at the common juncture is that produced by the predetermined number plus one (N+1) or more signal paths having signals present thereon.

6. Apparatus in accordance with claim 4 including first transistor means coupled to said common juncture, said first transistor means being biased to a low conduction condition when the voltage at the common juncture is that produced by less than the predetermined number (N) of signal paths having signals present thereon, being biased in a first high conduction condition when the voltage at the common juncture is that produced by the predetermined number (N) of signal paths having signals present thereon, and being biased in a second high conduction condition when the voltage at the common juncture is that produced by the predetermined number plus one (N+1) or more signal paths having signals present thereon;

exclusive-OR means connected to the first transistor means and to said enabling means, said exclusive-OR means being operable to produce said first indication during an enabling signal when said first transistor means is in the first or second high conduction condition and to produce said second indication during an enabling signal when said first transistor means is in the low conduction condition;

second transistor means coupled to said first transistor means, said second transistor means being biased to a low conduction condition when said first transistor means is in the low conduction condition or in the first high conduction condition, and being biased to a high conduction condition when said first transistor means is in the second high conduction condition; and third transistor means coupled to the second transistor means and to said output means, said third transistor means being biased to a low conduction condition when said second transistor means is in the low conduction condition thereby producing said first indication to said output means, and being biased to a high conduction condition when said second transistor means is in the high conduction condition thereby producing said second indication to said output means.

7. Apparatus in accordance with claim 6 wherein said first transistor means includes a first transistor having its base connected to said common juncture, its emitter connected through a resistance to a first source of voltage, and its collector connected through a resistance to a second source of voltage and to said enabling means; and a resistance connected between said first source of voltage and said common juncture;

the conducting condition of the first transistor being determined by the voltage produced at the common juncture by the number of signal paths having signals present thereon;

said second transistor means includes a second transistor having its emitter connected to the collector of the first transistor, its base connected to a source of voltage, and its collector connected through a resistance to a source of voltage; and said third transistor means includes a third transistor having its base connected to the collector of the second transistor, its collector connected to a point of reference potential, and its emitter connected through a resistance to a voltage source and also to said output means.

* * * * *